United States Patent
Zhang et al.

(10) Patent No.: US 11,102,888 B2
(45) Date of Patent: Aug. 24, 2021

(54) SUBSTRATE, DISPLAY PANEL AND FABRICATION METHOD THEREOF, AND SPLICED SCREEN

(71) Applicants: BEIJING BOE DISPLAY TECHNOLOGY CO., LTD., Beijing (CN); BOE TECHNOLOGY GROUP CO., LTD., Beijing (CN)

(72) Inventors: Wei Zhang, Beijing (CN); Lili Jia, Beijing (CN); Weihao Hu, Beijing (CN); Hao Zhou, Beijing (CN); Zheng Wang, Beijing (CN); Jin Han, Beijing (CN); Hai Chi, Beijing (CN); Yu Zhang, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 57 days.

(21) Appl. No.: 16/336,567

(22) PCT Filed: May 30, 2018

(86) PCT No.: PCT/CN2018/089036
§ 371 (c)(1),
(2) Date: Mar. 26, 2019

(87) PCT Pub. No.: WO2019/037501
PCT Pub. Date: Feb. 28, 2019

(65) Prior Publication Data
US 2020/0029439 A1 Jan. 23, 2020

(30) Foreign Application Priority Data
Aug. 22, 2017 (CN) .......................... 201710725536.3

(51) Int. Cl.
H05K 1/00 (2006.01)
H05K 1/18 (2006.01)
H05K 3/32 (2006.01)

(52) U.S. Cl.
CPC ............. *H05K 1/189* (2013.01); *H05K 3/321* (2013.01); *H05K 2201/10128* (2013.01); *H05K 2201/10984* (2013.01)

(58) Field of Classification Search
CPC .................. H05K 1/189; H05K 3/321; H05K 2201/10128; H05K 2201/10984
See application file for complete search history.

(56) References Cited

U.S. PATENT DOCUMENTS

| | | | | |
|---|---|---|---|---|
| 5,041,183 A | * | 8/1991 | Nakamura | ............. H05K 3/323 156/264 |
| 5,745,208 A | * | 4/1998 | Grupp | ................... G02F 1/1345 349/153 |

(Continued)

FOREIGN PATENT DOCUMENTS

| | | |
|---|---|---|
| CN | 102723445 A | 10/2012 |
| CN | 105223747 A | 1/2016 |

(Continued)

OTHER PUBLICATIONS

CN 106324927A English translation conducted by espacenet (Year: 2017).*

(Continued)

*Primary Examiner* — Pete T Lee
(74) *Attorney, Agent, or Firm* — Leason Ellis LLP

(57) ABSTRACT

At least one embodiment of the present disclosure relates to a substrate, a display panel and a fabrication method thereof, and a spliced screen. The substrate includes a base having a display region and a non-display region, and the non-display region includes a bonding region arranged at an end-side of the base.

15 Claims, 6 Drawing Sheets

(56) References Cited

U.S. PATENT DOCUMENTS

| | | | |
|---|---|---|---|
| 10,170,462 B2 | 1/2019 | Choi et al. | |
| 2011/0074729 A1* | 3/2011 | Im | G02F 1/1339 345/174 |
| 2017/0059926 A1 | 3/2017 | Kim | |
| 2017/0148373 A1 | 5/2017 | Eom et al. | |
| 2019/0204669 A1 | 7/2019 | Lee et al. | |

FOREIGN PATENT DOCUMENTS

| | | |
|---|---|---|
| CN | 106447070 A | 2/2017 |
| CN | 107065334 | 8/2017 |
| CN | 106324927 A | 11/2017 |
| CN | 108153070 A | 6/2018 |
| KR | 20160028550 | 3/2016 |

OTHER PUBLICATIONS

CN 106324927 English Translation published on Jan. 11, 2017 (Year: 2017).*
CN 105223747 A English Translation published on Jan. 6, 2016 (Year: 2016).*
International Search Report and Written Opinion in corresponding International Patent Application No. PCT/CN2018/089036 dated Aug. 8, 2018 (an English translation attached hereto). 16 pages.
Chinese Office Action in corresponding Chinese Application No. 201710725536.3 dated Jul. 8, 2019 (an English translation attached hereto). 19 pages.
Extended European Search Report dated Jul. 7, 2021 corresponding to European Patent Application No. 18847332.6; 8 pages.

* cited by examiner

SUBSTRATE, DISPLAY PANEL AND FABRICATION METHOD THEREOF, AND SPLICED SCREEN

CROSS-REFERENCE TO RELATED PATENT APPLICATIONS

This application is a U.S. National Stage Application under 35 U.S.C. § 371 of International Patent Application No. PCT/CN2018/089036, filed May 30, 2018, which claims the benefit of priority of Chinese Patent Application No. 201710725536.3 filed on Aug. 22, 2017, both of which are incorporated by reference in their entireties as part of the present application.

TECHNICAL FIELD

At least one embodiment of the present disclosure relates to a substrate and a fabrication method thereof, a display panel and a fabrication method thereof, and a spliced screen.

BACKGROUND

With development of electronic display products, people pay more and more attention to their appearances and functions, etc. In a preparation procedure of the electronic display product, a bonding region occupies a relatively large space, which limits development of an extremely narrow frame of the corresponding electronic product. For example, in a field of spliced screens, excessively large gaps between adjacent screens will affect a visual effect of a display image.

SUMMARY

At least one embodiment of the present disclosure provides a substrate, which comprises a base which has a display region and a non-display region and the non-display region includes a bonding region arranged at an end-side of the base.

For example, in the substrate provided by at least one embodiment of the present disclosure, the bonding region includes: a joining part, provided on the end-side of the base; and a flexible circuit board, provided on a surface of the joining part away from the end-side, and the joining part being electrically connected with the flexible circuit board and a signal line on the base.

For example, the substrate provided by at least one embodiment of the present disclosure further comprises a driving chip provided on the flexible circuit board, and the joining part electrically connects the driving chip with the signal line of the base.

For example, in the substrate provided by at least one embodiment of the present disclosure, the joining part includes: a conductive adhesive layer, provided on the end-side; the conductive adhesive layer includes a plurality of conductive adhesive strips spaced apart from one another, and the conductive adhesive strips are connected in one-to-one correspondence with the signal lines in the base.

For example, in the substrate provided by at least one embodiment of the present disclosure, the joining part further includes: an adhesion layer, provided on a surface of the conductive adhesive layer away from the end-side; the adhesion layer is a conductive layer includes an insulating host material and conductive particles doped in the host material and spaced apart from one another.

For example, in the substrate provided by at least one embodiment of the present disclosure, the conductive adhesive layer is a silver adhesive layer.

For example, in the substrate provided by at least one embodiment of the present disclosure, a number of the bonding region are at least two, and each of the bonding regions is provided on the end-side of the base.

At least one embodiment of the present disclosure provides a display panel, comprises: a first substrate as mentioned above; and a second substrate, cell-assembled with the first substrate.

For example, in the display panel provided by at least one embodiment of the present disclosure, the bonding region includes: a joining part, provided on an end-side of the base; and a flexible circuit board, provided on a surface of the joining part away from the end-side, the joining part being electrically connected with the flexible circuit board and a signal line in the display region.

For example, in the display panel provided by at least one embodiment of the present disclosure, the joining part and the flexible circuit board extend in a direction perpendicular to a display surface of the display panel, so as to be provided on an end-side of the second substrate on a same side as the end-side of the first substrate.

For example, in the display panel provided by at least one embodiment of the present disclosure, one of the first substrate and the second substrate is an array substrate, and the other is a color filter substrate.

For example, in the display panel provided by at least one embodiment of the present disclosure, on a side provided with the bonding region, a projection of a side edge of the first substrate coincides with a projection of a side edge of the second substrate on the display surface of the display panel.

For example, in the display panel provided by at least one embodiment of the present disclosure, the signal line on the base is disposed on an upper side of the base and extended to the end-side of the base, an end surface of the signal line is aligned with the end-side of the base.

At least one embodiment of the present disclosure provides a spliced screen, which comprises at least two display screens, and at least one of the display screens includes the display panel as mentioned above.

At least one embodiment of the present disclosure provides a fabrication method of a display panel, which comprises: providing a display panel to be processed, the display panel to be processed including a first substrate and a second substrate cell-assembled, the first substrate including a base, and the base having a display region and a non-display region; and arranging a bonding region on an end-side of the base.

For example, in the fabrication method of the display panel provided by at least one embodiment of the present disclosure, the display panel to be processed includes a dummy region and a non-dummy region, and the fabrication method further comprises: cutting off a portion of the display panel to be processed located in the dummy region, before arranging a bonding region.

For example, in the fabrication method of the display panel provided by at least one embodiment of the present disclosure, in the display panel to be processed, the first substrate and the second substrate both include a portion located in the dummy region; or the first substrate includes a portion located in the dummy region, and the second substrate is located in the non-dummy region.

For example, the fabrication method of the display panel provided by at least one embodiment of the present disclosure further comprises: rubbing side edges of the first substrate and the second substrate on a side where a bonding region is to be formed, so that a projection of the side edge of the first substrate coincides with a projection of the side edge of the second substrate on a display surface of the display panel.

For example, in the fabrication method of the display panel provided by at least one embodiment of the present disclosure, the arranging the bonding region on the end-side of the base includes: forming a joining part on the end-side of the base; and forming a flexible circuit board on a surface of the joining part away from the end-side; the joining part being electrically connected with the flexible circuit board and a signal line on the base.

For example, in the fabrication method of the display panel provided by at least one embodiment of the present disclosure, the joining part and the flexible circuit board extend in a direction perpendicular to the display surface of the display panel, so as to be formed on an end-side of the second substrate on a same side as the end-side of the first substrate.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

REFERENCE SIGNS

Figure 1A:
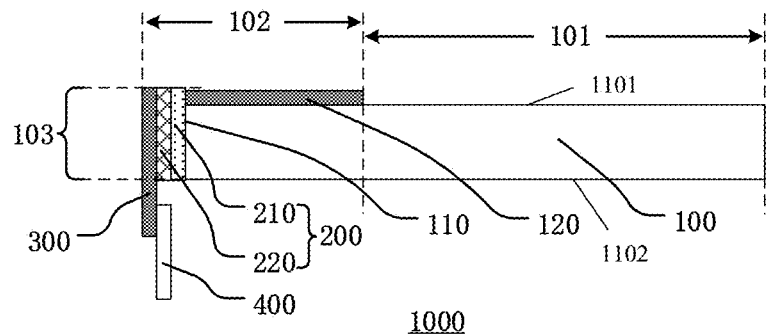
FIG. 1A is a cross-sectional view of a substrate provided by an embodiment of the present disclosure.

100—base; 101—display region; 102—non-display region; 103—bonding region; 104—dummy region; 110—end-side; 120—signal line; 200—joining part; 210—conductive adhesive layer; 211—conductive adhesive strip; 220—adhesion layer; 300—flexible circuit board; 400—driving chip; 500—second substrate; 600—bonding head; 700—rubbing roller; 1000—substrate.

DETAILED DESCRIPTION

In order to make objects, technical details and advantages of the embodiments of the present disclosure apparent, the technical solutions of the embodiment will be described in a clearly and fully understandable way in connection with the drawings related to the embodiments of the present disclosure. It is obvious that the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms, such as "first," "second," or the like, which are used in the description and the claims of the present disclosure, are not intended to indicate any sequence, amount or importance, but for distinguishing various components. The terms, such as "comprise/comprising," "include/including," or the like are intended to specify that the elements or the objects stated before these terms encompass the elements or the objects and equivalents thereof listed after these terms, but not preclude other elements or objects. The terms, such as "connect/connecting/connected," "couple/coupling/coupled" or the like, are not limited to a physical connection or mechanical connection, but may include an electrical connection/coupling, directly or indirectly. The terms, "on," "under," "left," "right," or the like are only used to indicate relative position relationship, and when the position of the object which is described is changed, the relative position relationship may be changed accordingly.

At least one embodiment of the present disclosure provides a substrate and a fabrication method thereof, a display panel and a fabrication method thereof, and a spliced screen. The substrate comprises a base, the base having a display region and a non-display region, and the non-display region including a bonding region arranged on an end-side of the base. The bonding region is arranged on the end-side of the base, which may reduce space occupied by the bonding region, in a direction parallel to a plane where the base is located, that is, in a direction parallel to a display surface, and thus, may reduce a width of the non-display region of the substrate, so as to facilitate implementing an extremely narrow frame of the substrate.

Hereinafter, the substrate and the fabrication method thereof, the display panel and the fabrication method thereof, and the spliced screen according to at least one embodiment of the present disclosure will be described in conjunction with the accompanying drawings.

At least one embodiment of the present disclosure provides a substrate 1000. FIG. 1A is a cross-sectional view of the substrate provided by the embodiment of the present disclosure. For example, as shown in FIG. 1A, the substrate comprises a base 100, the base 100 including a display region 101 and a non-display region 102, the base including a first main surface 1101 disposed on a display side, a second main surface 1102 opposite to the first main surface 1101 and an end-side 110 connected between the first main surface 1101 and the second main surface 1102, the non-display region 102 including a bonding region 103 arranged at an end-side 110 of the base 100. In this way, a width of a frame region of the substrate (the non-display region of the substrate) may be reduced, to implement an extremely narrow frame. Herein, the first main surface 1101 is an upper-side, the second main surface 1102 is a down-side, the end-side is located between the upper-side and the down-side, and the upper-side is the surface at a displaying side.

In at least one embodiment of the present disclosure, the number of bonding regions arranged on the base will not be limited, and may be designed as actually required.

Figure 1B:
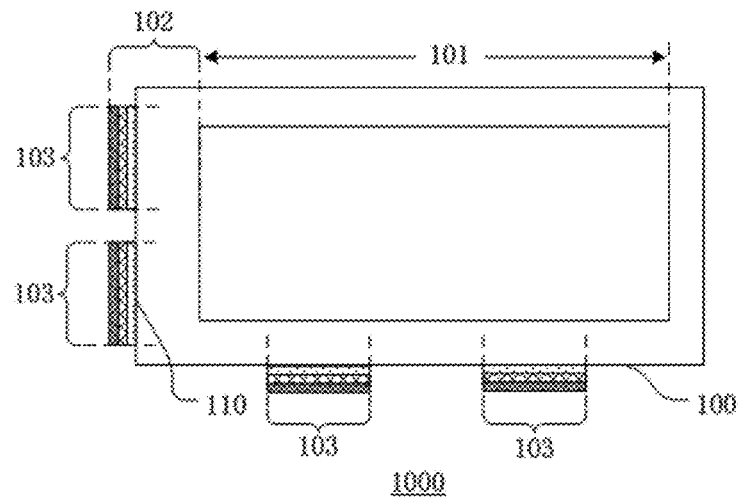
FIG. 1B is a plan view of a substrate provided by an embodiment of the present disclosure.

For example, in a substrate provided by at least one embodiment of the present disclosure, FIG. 1B is a plan view of the substrate provided by the embodiment of the present disclosure. As shown in FIG. 1B, at least two bonding regions 103 may be arranged in the substrate 1000, for example, each bonding region 103 may be arranged at an end-side 110 of a base 100. For example, a plurality of bonding regions 103 may be arranged at a same end-side 110 of the base 100, or may also be arranged on different end-sides of the base 100; and the number of bonding regions 103 and positions for arranging the same may be set according to wirings (for example, a signal line 120 as described below) of the substrate 1000.

For example, in at least one embodiment of the present disclosure, as shown in FIG. 1A, a signal line 120 is provided on a base 100. A type of the signal line 120 will not be limited in the embodiment of the present disclosure. For example, the signal line 120 may be one or a combination of a gate line, a data line, a common electrode line, a power line, a ground line, a frame start scan line, a reset line, and so on. For example, in at least one embodiment of the present disclosure, as shown in FIG. 1A, at a bonding region 103 of a base 100, a signal line 120 may be set to extend to an edge of the base 100, so that during a subsequent procedure of the bonding operation, it is easier to make an external control element (for example, a driving chip 400 as described below) electrically connect with the signal line 120.

In at least one embodiment of the present disclosure, as shown in FIG. 1A, a width of a non-display region 102 of a base 100 will not be limited, and in a case where it is ensured that a signal line 120 may extend to the end-side 110 provided with a bonding region 103, the width of the non-display region 102 may be minimized. The signal lines 120 are disposed on the first main surface 1101 and are extended to the end-side 110, and an end surface of the signal line is aligned with the end-side 110 of the base.

For example, in at least one embodiment of the present disclosure, a substrate may further comprise a joining part and a flexible circuit board, the joining part being provided on an end-side of a base, the flexible circuit board being provided on a surface of the joining part away from the end-side, the joining part and the flexible circuit board being located in a bonding region, and the joining part being electrically connected with the flexible circuit board and a signal line on the base. In this way, the joining part and the flexible circuit board may connect the signal line on the substrate with an external control element.

For example, in at least one embodiment of the present disclosure, as shown in FIG. 1A, a substrate 1000 may further comprise a joining part 200, the joining part 200 being provided in a bonding region 103, and electrically connected with a signal line 120 in a base 100.

For example, in at least one embodiment of the present disclosure, as shown in FIG. 1A, a bonding region 103 of the substrate 1000 may be further provided therein with a flexible circuit board 300, and the flexible circuit board 300 is electrically connected with a joining part 200. The joining part 200 and the flexible circuit board 300 play a role in circuit connecting, both intended to implement connection between a signal line 120 in a base 100 and an external control element.

For example, in at least one embodiment of the present disclosure, a substrate may further comprise a driving chip, the driving chip being provided on a flexible circuit board, and a joining part electrically connecting the driving chip with a signal line of a base. Exemplarily, as shown in FIG. 1A, the substrate 1000 may further comprise a driving chip 400 provided on a flexible circuit board 300. The driving chip 400 is electrically connected with a signal line 120 on a base 100 through a joining part 200 and a flexible circuit board 300. In this way, the driving chip 400 may control a signal in the signal line 120, to control a function (for example, display, touch control, etc.) of the substrate.

The base 100 may include a plurality of different types of signal lines 120, and thus, the joining part 200 needs to be designed, so that the driving chip 400 may individually control different signal lines 120.

Figure 2:
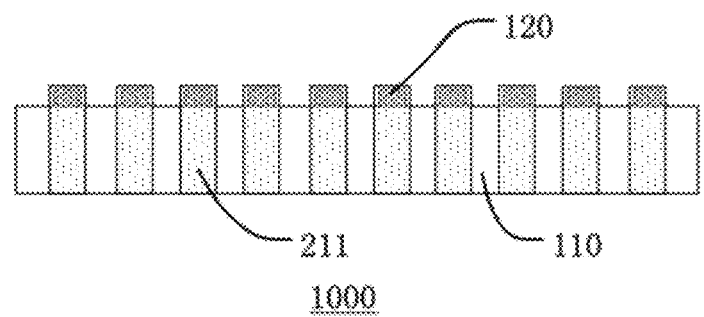
FIG. 2 is a schematic diagram of a mode for arranging a conductive adhesive layer in the substrate shown in FIG. 1A.

FIG. 2 is a schematic diagram of a mode of arranging a conductive adhesive layer in the substrate 1000 shown in FIG. 1A.

For example, in at least one embodiment of the present disclosure, a joining part includes a conductive adhesive layer provided on an end-side of a base, the conductive adhesive layer includes a plurality of conductive adhesive strips spaced apart from one another, and the conductive adhesive strips are connected in one-to-one correspondence with signal lines in the base. Exemplarily, as shown in FIG. 1A and FIG. 2, a joining part 200 may include a conductive adhesive layer 210 provided on an end-side 110 of a base 100, the conductive adhesive layer 210 may include a plurality of conductive adhesive strips 211 spaced apart from one another, and the conductive adhesive strips 211 are connected in one-to-one correspondence with signal lines 120 on the base 100. For example, the conductive adhesive strip 211 may also have a portion provided on a main surface of the base 110 (the main surface of the base 100 on a side provided with the signal line 120), to increase a contact area between the conductive adhesive strip 211 and the signal line 120. In at least one embodiment of the present disclosure, a specific arrangement mode of conductive adhesive strips will not be limited, and may be set as actually required, as long as it is ensured that the conductive adhesive strips may be connected in one-to-one correspondence with signal lines.

In at least one embodiment of the present disclosure, a material of a conductive adhesive layer will not be limited. For example, the conductive adhesive layer may be made of a curable material (for example, a resin) doped with conductive particles (for example, one or a combination of powder of gold, silver, copper, aluminum, zinc, iron and nickel, graphite, some conductive compounds, and so on). For example, in the substrate provided by at least one embodiment of the present disclosure, the conductive adhesive layer may be a silver adhesive layer, for example, the silver adhesive layer may be a photo-curable material doped with silver particles.

In at least one embodiment of the present disclosure, a mode for forming a conductive adhesive layer will not be limited. For example, after a silver adhesive layer material is formed on an end-side of a base by using a transfer technology and the like, the silver adhesive layer material is cured to form the conductive adhesive layer including a plurality of conductive adhesive strips by using ultraviolet light (UV light) or laser lamp irradiation treatment.

For example, in at least one embodiment of the present disclosure, a joining part further includes an adhesion layer, and the adhesion layer is provided on a surface of a conductive adhesive layer away from an end-side. Exemplarily, as shown in FIG. 1A, a substrate 1000 may further comprise an adhesion layer 220 provided on a surface of a conductive adhesive layer 210 away from an end-side 110. A flexible circuit board 300 is fixed onto the conductive adhesive layer 210 through the adhesion layer 220, and electrical connection between the flexible circuit board 300 and the conductive adhesive layer 210 may be realized.

In at least one embodiment of the present disclosure, a structure of the adhesion layer will not be limited, as long as the adhesion layer may fix connection between a conductive adhesive layer and a flexible circuit board without affecting circuit connection relationship between a signal line and the flexible circuit board. For example, in at least one embodiment of the present disclosure, a material for preparing the adhesion layer may include an insulating host material and conductive particles doped in the host material and spaced apart from one another. Exemplarily, after the flexible circuit board 300 is provided on the conductive adhesive layer 210 through the adhesion layer 220, a press bonding process is performed on a side of the flexible circuit board 300 away from a base 100, so that a portion of the adhesion layer 220 corresponding to the conductive adhesive strip 211 is electrically conductive, in which way, circuit connection between a signal line 120 and the flexible circuit board 300 may be implemented.

In at least one embodiment of the present disclosure, thicknesses of the conductive adhesive layer, the adhesion layer, and the flexible circuit board (in a direction perpendicular to an end-side) will not be limited. For example, the thickness of the conductive adhesive layer may be about 2 micrometers to 4 micrometers, and further may be about 2.5 micrometers, 3 micrometers, 3.5 micrometers, and so on; the thickness of the adhesion layer may be about 12 micrometers to 18 micrometers, and further may be about 14 micrometers, 15 micrometers, 16 micrometers, 17 micrometers, and so on; and the thickness of the flexible circuit board may be about 0.8 millimeters to 1.2 millimeters, and further may be about 0.9 millimeters, 1 millimeters, 1.1 millimeters, and so on.

At least one embodiment of the present disclosure provides a display panel, the display panel comprising a first substrate, wherein, the first substrate may be a substrate according to any one of the foregoing embodiments.

A type of the display panel will not be limited in the embodiment of the present disclosure. For example, the display panel may be an organic light emitting diode (OLED) display panel, a liquid crystal display panel, or an electronic paper display panel, and the like.

Figure 3:
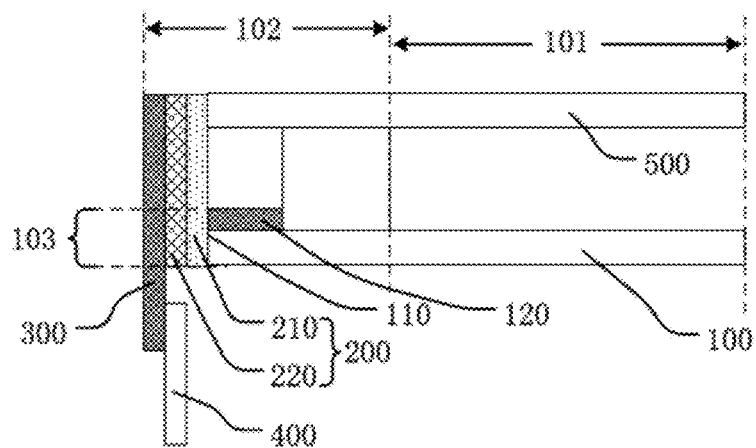
FIG. 3 is a cross-sectional view of a display panel provided by an embodiment of the present disclosure.

FIG. 3 is a cross-sectional view of the display panel provided by the embodiment of the present disclosure. In at least one embodiment of the present disclosure, as shown in FIG. 3, a display panel may further comprise a second substrate 500, wherein, the second substrate 500 and a first substrate 1000 are cell-assembled.

Figure 4A:
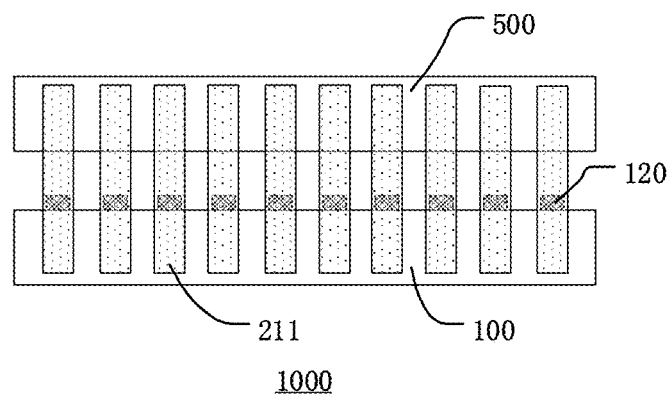
FIG. 4A is a schematic diagram of a mode for arranging a conductive adhesive layer in the display panel shown in FIG. 3.
Figure 4B:
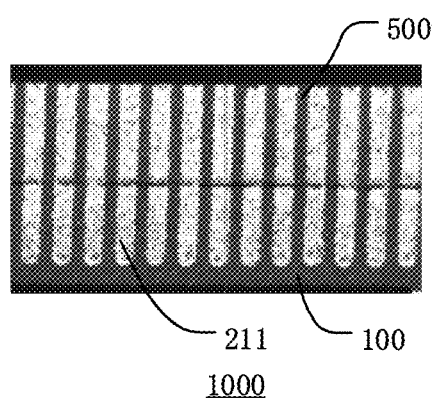
FIG. 4B is a physical diagram of the display panel shown in FIG. 4A.

For example, in at least one embodiment of the present disclosure, FIG. 4A is a schematic diagram of a mode for arranging a conductive adhesive layer in a display panel shown in FIG. 3, and FIG. 4B is a physical diagram of the display panel shown in FIG. 4A. For example, as shown in FIG. 3, FIG. 4A and FIG. 4B, a joining part 200 and a flexible circuit board 300 are set to extend in a direction perpendicular to a display surface of the display panel, and may extend to an end-side of a second substrate 500 on a same side as an end-side of a first substrate 1000, that is, an end-side on a same side of a base 100; for example, a conductive adhesive strip 211 in the joining part 200 in FIG. 4A extends to the second substrate 500. In this way, a contact area between the joining part 200, the flexible circuit board 300 and the display panel may be increased, so that the flexible circuit board 300 is more firmly mounted on the display panel; in addition, the above-described mode for arranging the joining part 200 and the flexible circuit board 300 may further play a certain role in encapsulation, to prevent a foreign object from intruding into a gap between the first substrate 1000 and the second substrate 500.

Setting of a side face (a side face provided with a bonding region 103) of the display panel will not be limited in the embodiment of the present disclosure, and the side face of the display panel provided with the bonding region 103 may be set to an inclined surface or a surface perpendicular to the display surface of the display panel. For example, in at least one embodiment of the present disclosure, as shown in FIG. 3, FIG. 4A and FIG. 4B, on a side provided with a bonding region 103, orthogonal projections of side edges of a first substrate 1000 and a second substrate 500 on the display surface of a display panel coincide. In the present disclosure, the conductive adhesive layer 210 extends to a lower surface (a second main surface) of the first substrate 100 which is away from the second substrate 500 and extends to an upper surface (a first main surface) of the second substrate 500 which is away from the first substrate 100, and are not beyond the lower surface of the first substrate 100 and the upper surface of the second substrate 500. Alternatively, the flexible circuit board 300 may be extended not to go beyond the upper-side of the color filter substrate, and the flexible circuit board has a portion which goes beyond the down-side of the array substrate, the portion is provided with the driving chip on a side close to the array substrate.

Types of the first substrate and the second substrate will not be limited in the embodiment of the present disclosure. For example, one of the first substrate and the second substrate may be an array substrate, and the other may be a color filter substrate; or, one of the first substrate and the second substrate may be an array substrate, and the other may be a packaging cover plate.

At least one embodiment of the present disclosure provides a spliced screen, the spliced screen comprising at least two display screens, at least one of the display screens including the display panel according to the above-described embodiment. A frame of the display screen including the display panel according to the above-described embodiment is relatively narrow, which may reduce a width of a non-display region between adjacent display screens, and improve a visual effect of a display image of the spliced screen.

At least one embodiment of the present disclosure provides a fabrication method of a substrate, comprising: providing a base, the base having a display region and a non-display region; and arranging a bonding region on an end-side of the base. Related contents in the foregoing embodiments (the embodiments related to the substrate) may be referred to for a specific structure of the substrate prepared by using the above-described fabrication method, which will not be repeated here in the present disclosure.

Figure 5A:
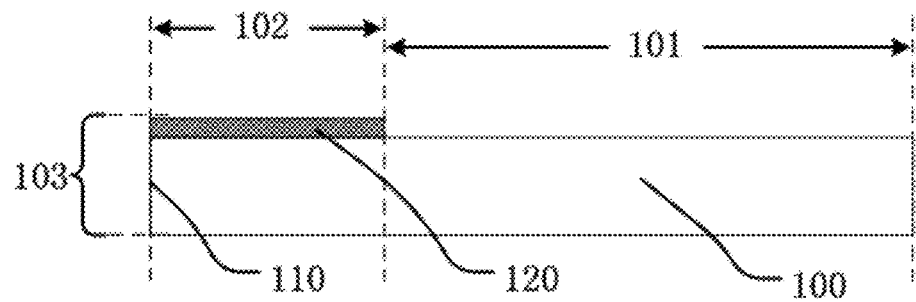
FIG. 5A to FIG. 5D are flow charts of a fabrication method of a substrate provided by an embodiment of the present disclosure.

FIG. 5A to FIG. 5D are flow charts of the fabrication method of the substrate provided by the embodiment of the present disclosure. As shown in FIG. 5A to FIG. 5D, with fabrication of the substrate 1000 shown in FIG. 1A as an example, the fabrication method of the substrate provided by at least one embodiment of the present disclosure may comprise steps below:

As shown in FIG. 5A, a base 100 is provided, the base 100 includes a display region 101 and a non-display region 102, and in the non-display region 102, a bonding region 103 is arranged on an end-side 110 of the base 100. A plurality of signal lines 120 are provided on the base 100, for example, the signal lines 120 may extend to an edge of the base 100 provided with the end-side 110. The signal lines 120 are disposed on the first main surface 1101 and are extended to the end-side 110, and an end surface of the signal line is aligned with the end-side 110 of the base.

Figure 5B:
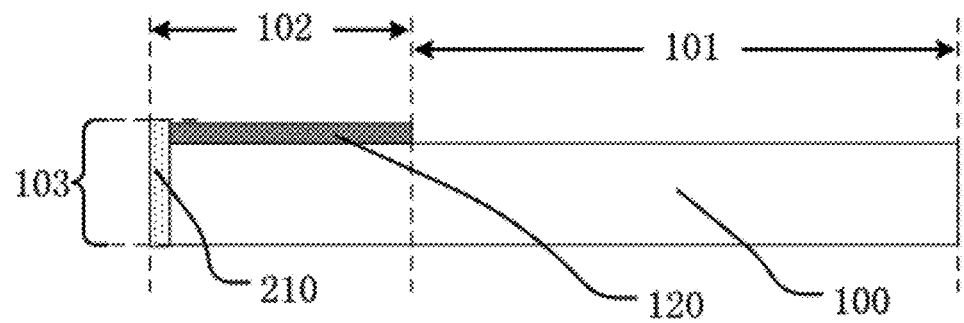

As shown in FIG. 5B, a conductive adhesive layer 210 is formed on the end-side 110 of the base 100, the conductive adhesive layer 210 is connected with the signal line 120, and then a silver adhesive layer is cured. For example, a procedure for forming the conductive adhesive layer 210 may include: coating the silver adhesive layer including a plurality of silver adhesive conductive lines on the end-side 110 of the base 100 by using a transfer technology, and then curing the silver adhesive layer to form the conductive adhesive layer 210, with the silver adhesive conductive line correspondingly formed into a conductive adhesive strip. The conductive adhesive layer 210 may include a plurality of conductive adhesive strips 211 spaced apart from one another, and the respective conductive adhesive strips 211 and the respective signal lines 120 are arranged in one-to-one correspondence. Related contents shown in FIG. 4A may be referred to for a specific arrangement mode of the conductive adhesive layer 210, which will not be repeated here in the embodiments of the present disclosure.

Figure 5C:
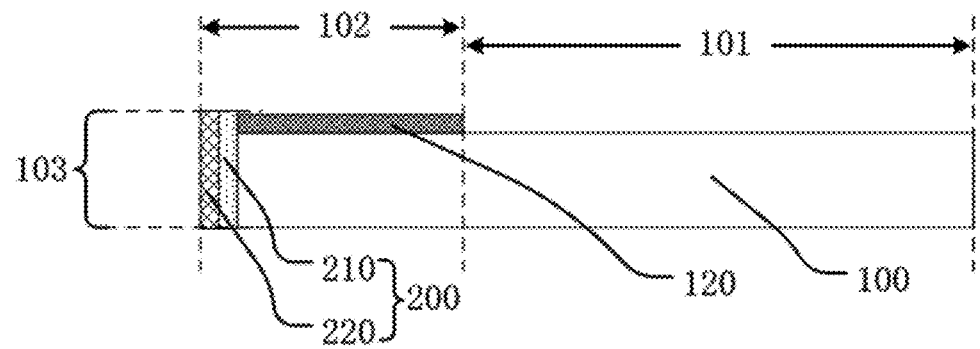

As shown in FIG. 5C, an adhesion layer 220 is formed on a surface of the conductive adhesive layer 210 away from the end-side 110. Related contents in the foregoing embodiments (the embodiments related to the substrate) may be referred to for a preparation material of the adhesion layer 220, which will not be repeated here in the present disclosure.

It should be noted that, in the embodiment of the present disclosure, the setting of the adhesion layer 220 may strengthen firmness of connection between the conductive adhesive layer 210 and a flexible circuit board 300; if the flexible circuit board 300 may be directly connected with the conductive adhesive layer 210, the adhesion layer 220 may not be provided between the flexible circuit board 300 and the conductive adhesive layer 210. Whether or not the adhesion layer 220 is provided in the substrate 1000 will not be limited in the embodiment of the present disclosure.

Figure 5D:
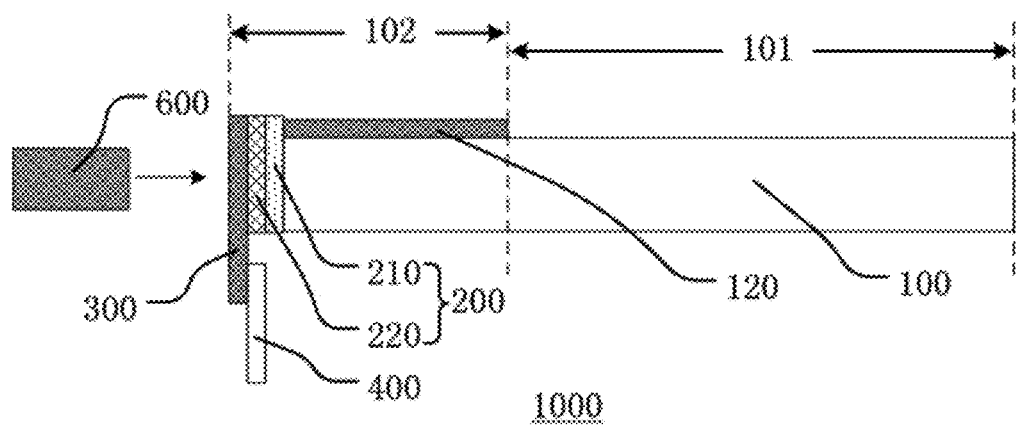

As shown in FIG. 5D, the flexible circuit board 300 is attached to a side of the adhesion layer 220 away from the conductive adhesive layer 210, and then the substrate 1000 is subjected to a press bonding process with a bonding head 600, on a side of the substrate 1000 provided with the bonding region 103, so that a portion of the adhesion layer 220 corresponding to the conductive adhesive strip 211 is electrically conductive. In this way, electrical connection between the flexible circuit board 300 and the signal line 120 may be implemented.

It should be noted that, in the fabrication procedure of the entire substrate 1000, the curing operation of the conductive adhesive layer 210 may be arranged according to actual needs, which will not be limited here in the embodiment of the present disclosure. For example, the curing operation of the conductive adhesive layer 210 may be performed after the press bonding process is completed.

At least one embodiment of the present disclosure provides a fabrication method of a display panel, comprising: providing a display panel to be processed, the display panel to be processed comprising a first substrate and a second substrate cell-assembled, the first substrate including a base, and the base having a display region and a non-display region; and setting a bonding region on an end-side of the base. In the display panel, the bonding region is formed on an end-side of the display panel (the base of the first substrate), which may reduce space occupied by the bonding region in a direction parallel to a plane where the base is located, that is, in a direction parallel to a display surface, and thus, may reduce a width of the non-display region of the display panel, so as to facilitate implementing an extremely narrow frame of the display panel.

For example, the display panel comprises the substrate according to the foregoing embodiment. In the fabrication procedure of the display panel, a monolithic display panel mother board is usually fabricated firstly, then a cutting process is performed to obtain a plurality of display panel sub-boards, and then the display panel sub-board is subsequently processed to form a single display panel.

Figure 6A:
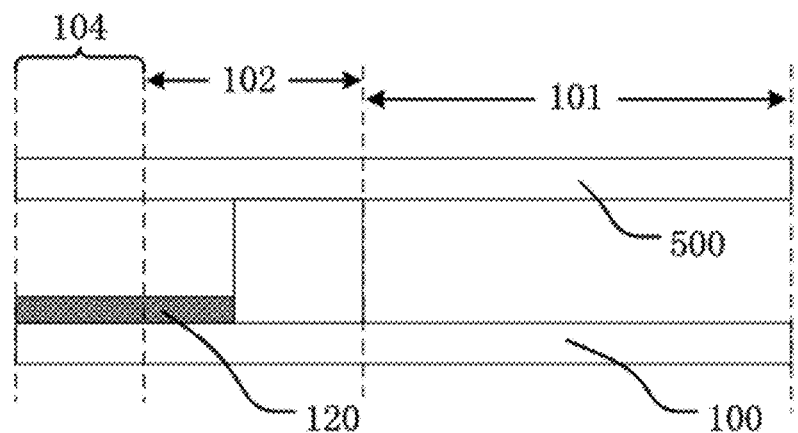
FIG. 6A to FIG. 6E are flow charts of a fabrication method of a display panel provided by an embodiment of the present disclosure.
Figure 6B:
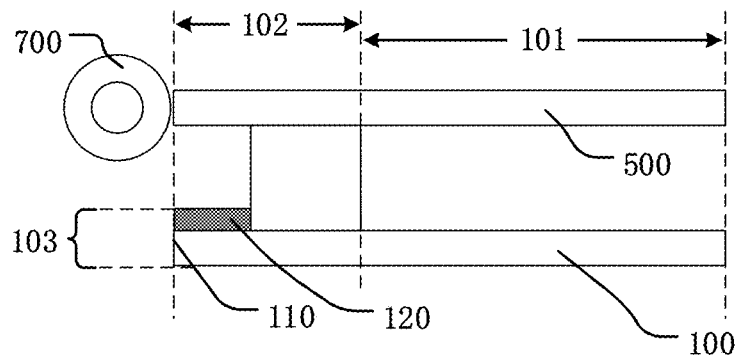

FIG. 6A to FIG. 6E are flow charts of the fabrication method of the display panel provided by the embodiment of the present disclosure. As shown in FIG. 6A to FIG. 6E, with fabrication of the display panel shown in FIG. 3 as an example, the fabrication method of the display panel provided by at least one embodiment of the present disclosure may comprise a procedure below:

As shown in FIG. 6A, in the cutting process of the display panel mother board, a portion of the display panel to be processed located in a dummy region 104 may be cut away, to obtain a display panel as shown in FIG. 6B. The region of the display panel to be processed located in the dummy region 104 may correspond to the bonding region in the current display panel, and in the embodiment of the present disclosure, the portion of display panel in the dummy region 104 may be removed, so that a width of the non-display region 102 of the display panel is relatively small, and narrow frame design may be implemented on the display panel. The display panel to be processed includes a dummy region and a non-dummy region, and the non-dummy region includes a display region 101 and a non-display region 102 located around the display region 101.

The operation of cutting the portion of the display panel located in the dummy region 104 may be performed in the procedure of cutting the display panel mother board, or may also be performed in the procedure of cutting the display panel sub-board after the display panel sub-board is obtained. For example, in at least one embodiment of the present disclosure, a first substrate and a second substrate both include a portion located in a dummy region. Thus, in a procedure of cutting a display panel to be processed, it is necessary to cut both the first substrate and the second substrate, so as to remove the portion of the display panel to be processed located in the dummy region. For example, on a side where a bonding region is to be formed, side edges of the first substrate and the second substrate are rubbed, so that a projection of the side edge of the first substrate coincides with a projection of the side edge of the second substrate on the display surface of the display panel. In this way, difficulty in a subsequent fabrication process of the display panel may be reduced, and in a case where the display panel is used in a spliced screen, a gap between adjacent display panels in the spliced screen may be further reduced, to improve a display effect of the spliced screen.

In the cutting procedure of the display panel, cutting precision is not high, and a cut surface of the display panel is relatively rough, so in order to prevent damage to components in the display panel, a portion of a safety region is usually reserved. For example, in at least one embodiment of the present disclosure, in a fabrication procedure of a display panel as shown in FIG. 6A to FIG. 6B, a cut surface of the display panel may be subjected to an edge polishing process, and the display panel is cleaned, to ensure that a region in the display panel provided with a signal line 120 is free from debris contamination. Alternatively, during cutting the display panel, cutting may be performed along the outer edge of an extracting region of the signal lines, so that the end surfaces of the signal lines may be aligned with each other and also aligned with the end-sides of the first substrate 100 and/or the second substrate 500. Herein, an extracting region of the signal lines means a region where the signal lines extend to in order to be connected with an outer circuit, such as, an outer control circuit. Alternatively, the first substrate is an array substrate and the second substrate is a color filter substrate which does not include a portion positioned in the dummy region, and only the array substrate includes a portion positioned in the dummy region, thus, when cutting the display panel, a side edge of the color filter substrate which also corresponds to the extracting region of the signal lines may be used as a cutting reference line, cutting may be performed along the cutting reference line and only the array substrate is cut, and after cutting, the end surfaces of the signal lines may be aligned with each other and also aligned with the end-sides of the first substrate 100 and/or the second substrate 500.

For example, as shown in FIG. 6B, end-sides of a first substrate 1000 and a second substrate 500 may be rubbed (subjected to the edge polishing process) with a rubbing roller 700. For example, before rubbing, a protective adhesive may be formed on the end-sides of the first substrate 1000 and the second substrate 500, and the protective adhesive may improve flatness of the first substrate 1000 and the second substrate 500 after rubbing, and protect the first substrate 1000 and the second substrate 500 from excessive damage during rubbing, for example, prevent generation of a crack extending to the non-dummy region. The protective adhesive may be made of a seal adhesive.

For example, in at least one embodiment of the present disclosure, as shown in FIG. 6B, a fabricated display panel may comprise a first substrate 1000 and a second substrate 500 cell-assembled with the first substrate 1000, a base 100 of the first substrate including a display region 101 and a non-display region 102 located around the display region 101, and the non-display region 102 including a bonding region 103 located on an end-side 110 of the base 100 of the first substrate.

For example, in a fabrication method of a display panel provided by at least one embodiment of the present disclosure, the providing a bonding region on an end-side of the base includes: forming a joining part on the end-side of the base; and forming a flexible circuit board on a surface of the joining part away from the end-side; wherein, the joining part is electrically connected with the flexible circuit board and a signal line on the base. In this way, the joining part and the flexible circuit board may connect the signal line on a first substrate (base) with an external control element.

Figure 6C:
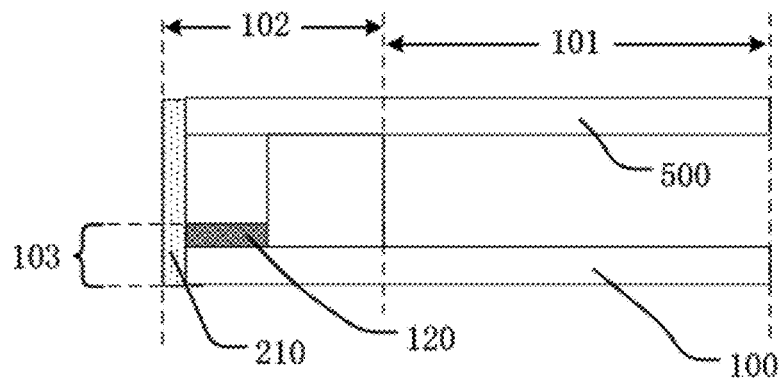

As shown in FIG. 6C, a conductive adhesive layer 210 is formed on the end-side 110 of the base 100 of the first substrate in the display panel. For example, the joining part and the flexible circuit board extend in a direction perpendicular to the display surface of the display panel, so as to be formed on an end-side of the second substrate on a same side as the first substrate. For example, the conductive adhesive layer 210 may extend onto the second substrate 500. Related contents in the foregoing embodiments (for example, the embodiments related to the display panel shown in FIG. 4A and FIG. 6) may be referred to for a specific structure of the formed conductive adhesive layer 210, which will not be repeated here in the embodiment of the present disclosure.

Figure 6D:
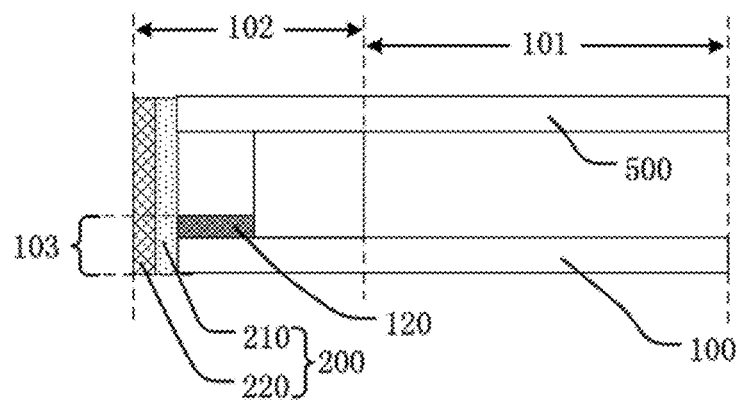

As shown in FIG. 6D, an adhesion layer 220 is formed on a side of the conductive adhesive layer 210 of the display panel away from the base 100 of the first substrate. It should be noted that, whether or not the adhesion layer 220 is provided in the display panel will not be limited in the embodiment of the present disclosure, and related contents on the adhesion layer 220 in the foregoing embodiments (the embodiments related to the fabrication method of the substrate) may be referred to for related description, which will not be repeated here.

Figure 6E:
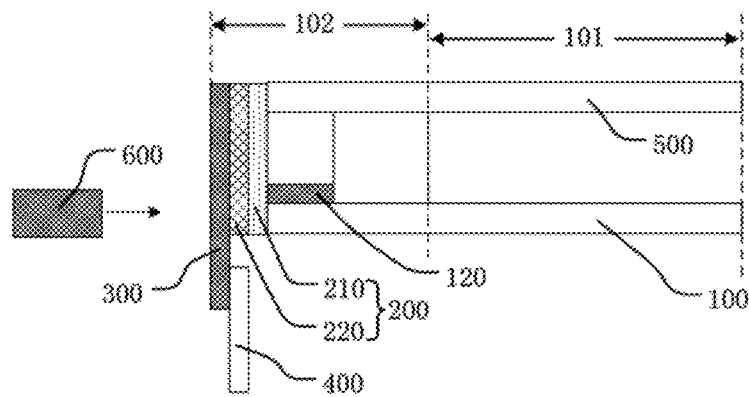

As shown in FIG. 6E, a flexible circuit board 300 is attached to a surface of the adhesion layer 220 of the display panel away from the conductive adhesive layer 210, and then the display panel is subjected to a press bonding process with a bonding head 600, on a side of the display panel provided with the bonding region, so that a portion of the adhesion layer 220 corresponding to the conductive adhesive strip 211 is electrically conductive. In this way, electrical connection between the flexible circuit board 300 and the signal line 120 may be implemented.

It should be noted that, in at least one embodiment of the present disclosure, a type of a display panel to be processed will not be limited.

For example, in some embodiments of the present disclosure, a first substrate and a second substrate of a display panel to be processed both include a portion located in a dummy region. A structure of the display panel to be processed may be as shown in FIG. 6A.

Figure 7:
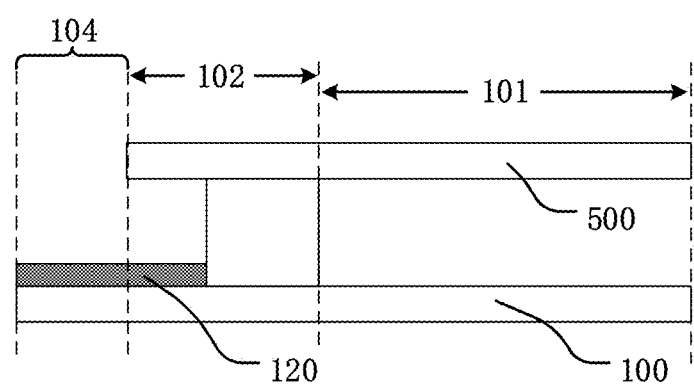
FIG. 7 is a structural schematic diagram of a display panel to be processed.

For example, in some embodiments of the present disclosure, in a display panel to be processed, a first substrate includes a portion located in a dummy region, and a second substrate is located in a non-dummy region. A structure of the display panel to be processed may be as shown in FIG. 7. Thus, in a cutting procedure of the display panel to be processed, it is only necessary to cut a portion of a base of the first substrate located in the dummy region.

At least one embodiment of the present disclosure provides the substrate and the fabrication method thereof, the display panel and the fabrication method thereof, and the spliced screen, and may have at least one of advantageous effects below:

(1) In the substrate provided by at least one embodiment of the present disclosure, the bonding region is arranged on the end-side of the substrate, which reduces the width of the non-display region of the substrate in a direction parallel to the plane where the display surface of the substrate is located, so as to implement an extremely narrow frame of the substrate.

(2) In the display panel provided by at least one embodiment of the present disclosure, the bonding region is arranged on the end-side of the display panel, which reduces the width of the non-display region of the display panel in the direction parallel to the plane where the display surface of the display panel is located, so as to implement an extremely narrow frame of the display panel.

For the present disclosure, the following statements should be noted:

(1) The accompanying drawings of the present disclosure involve only the structure(s) in connection with the embodiment(s) of the present disclosure, and other structure(s) may be referred to common design(s).

(2) For the purpose of clarity only, in accompanying drawings for illustrating the embodiment(s) of the present disclosure, the thickness and size of a layer or a structure may be enlarged or reduced, that is, the accompanying drawings are not drawn according to the actual scale.

(3) In case of no conflict, features in one embodiment or in different embodiments can be combined to obtain a new embodiment.

What are described above is related to the specific embodiments of the disclosure only and not limitative to the scope of the disclosure. The protection scope of the disclosure shall be based on the protection scope of the claims.

The invention claimed is:

1. A substrate, comprising:
a base, having a display region and a non-display region, wherein, the non-display region includes a bonding region arranged at an end-side of the base,
wherein, the bonding region includes:
a joining part, provided on the end-side of the base; and
a flexible circuit board, provided on a surface of the joining part away from the end-side,
the joining part being electrically connected with the flexible circuit board and a signal line on the base, an end surface of the joining part at a side of the joining part is aligned with a surface of the base at a side opposite to a side where the signal line is located,
wherein the joining part includes:
a conductive adhesive layer, provided on the end-side;
an adhesion layer, provided on a surface of the conductive adhesive layer away from the end-side,
the conductive adhesive layer includes a plurality of conductive adhesive strips spaced apart from one another, and the conductive adhesive strips are connected in one-to-one correspondence with the signal lines in the base, the adhesion layer is a conductive layer and includes an insulating host material and conductive particles doped in the host material and spaced apart from one another, and the adhesion layer is disposed between the flexible circuit board and the conductive adhesive layer.

2. The substrate according to claim 1, further comprising:
a driving chip, provided on the flexible circuit board;
wherein, the joining part electrically connects the driving chip with the signal line of the base.

3. A display panel, comprising:
a first substrate, according to claim 1;
a second substrate, cell-assembled with the first substrate, wherein an end surface of the joining part which is extended to a lower side of the first substrate is aligned with a lower surface of the first substrate, an end surface of the joining part which is extended to an upper side of the second substrate is aligned with an upper surface of the second substrate.

4. The display panel according to claim 3, wherein, the bonding region includes:
a joining part, provided on the end-side of the base; and
a flexible circuit board, provided on a surface of the joining part away from the end-side,
the joining part being electrically connected with the flexible circuit board and a signal line in the display region.

5. A spliced screen, comprising at least two display screens, at least one of the display screens including the display panel according to claim 3.

6. A fabrication method of a display panel, comprising:
providing a display panel to be processed, the display panel to be processed including a first substrate and a second substrate cell-assembled, the first substrate including a base, and the base having a display region and a non-display region; and
arranging a bonding region on an end-side of the base, wherein the arranging the bonding region on the end-side of the base includes:
forming a joining part on the end-side of the base; and
forming a flexible circuit board on a surface of the joining part away from the end-side;
the joining part being electrically connected with the flexible circuit board and a signal line on the base, an end surface of the joining part which is extended to a lower side of the first substrate is aligned with a lower surface of the first substrate, an end surface of the joining part which is extended to an upper side of the second substrate is aligned with an upper surface of the second substrate.

7. The substrate according to claim 1, wherein, the signal line on the base is disposed on an upper-side of the base and extended to the end-side of the base, an end surface of the signal line is aligned with the end-side of the base.

8. The display panel according to claim 4, wherein, the joining part includes:
a conductive adhesive layer, provided on the end-side;
the conductive adhesive layer includes a plurality of conductive adhesive strips spaced apart from one another, and the conductive adhesive strips are connected in one-to-one correspondence with the signal lines in the base.

9. The display panel according to claim 8, wherein, the joining part further includes:
an adhesion layer, provided on a surface of the conductive adhesive layer away from the end-side;
the adhesion layer is a conductive layer and includes an insulating host material and conductive particles doped in the host material and spaced apart from one another, and the adhesion layer and the driving chip and the conductive adhesive layer are electrically connected with each other,
wherein the adhesion layer is disposed between the flexible circuit board and the conductive adhesive layer.

10. The display panel according to claim 4, wherein, the signal line on the base is disposed on an upper side of the base and extended to the end-side of the base, an end surface of the signal line is aligned with the end-side of the base.

11. The display panel according to claim 9, wherein, the signal line on the base is disposed on an upper side of the base and extended to the end-side of the base, an end surface of the signal line is aligned with the end-side of the base.

12. The display panel according to claim 11, wherein the joining part and the flexible circuit board extend in a direction perpendicular to a display surface of the display panel, so as to be provided on an end-side of the second substrate on a same side as the end-side of the first substrate,
wherein, on a side provided with the bonding region, a projection of a side edge of the first substrate coincides with a projection of a side edge of the second substrate on the display surface of the display panel.

13. The display panel according to claim 12, further comprising:
a driving chip, provided on the flexible circuit board;
wherein, the joining part electrically connects the driving chip with the signal line of the base.

14. The display panel according to claim 13, wherein, the first substrate is an array substrate, and the second substrate is a color filter substrate.

15. The display panel according to claim 14, wherein the joining part extends to a down-side of the array substrate which is away from the color filter substrate and extends to an upper-side of the color filter substrate which is away from the array substrate, and does not extend beyond the down-side of the array substrate and the upper-side of the color filter substrate,
wherein the flexible circuit board extended not to go beyond the upper-side of the color filter substrate, and the flexible circuit board has a portion which goes beyond the down-side of the array substrate, the portion is provided with the driving chip on a side close to the array substrate.

* * * * *